United States Patent [19]

Berdat

[11] Patent Number: 4,849,777
[45] Date of Patent: Jul. 18, 1989

[54] LAMP DRIVER SCHEME

[75] Inventor: Henry F. Berdat, Manchester, Conn.

[73] Assignee: The Gerber Scientific Instrument Company, South Windsor, Conn.

[21] Appl. No.: 158,338

[22] Filed: Feb. 22, 1988

[51] Int. Cl.$^4$ ............................................. G03B 41/00
[52] U.S. Cl. ........................................................ 354/4
[58] Field of Search ............................................ 354/4

[56] References Cited

U.S. PATENT DOCUMENTS 3,330,182  7/1967  Gerber et al. ............................ 354/4
4,170,745 10/1979  Rich et al. ............................ 354/4 X
4,760,412  7/1988  Murzyn ................................... 354/4

Primary Examiner—Michael L. Gellner
Attorney, Agent, or Firm—McCormick, Paulding & Huber

[57] ABSTRACT

A system for projecting a spot of radiant energy includes a lamp for projecting a light spot onto a surface and includes means for providing a selection of differently sized spots. Drive means moves the light spot relative to the surface and is capable of moving the light spot at a maximum given velocity which is the same for all of the differently sized spots. Velocity output means produces a velocity signal representing the velocity of the spot and a normalized velocity signal is produced by dividing the volocity signal by the maximum given velocity. Each differently sized spot is assigned a different lamp command voltage signal and a selected one of the lamp command voltage signals is multiplied by the normalized velocity signal to produce a resultant lamp command voltage signal which energizes the lamp.

19 Claims, 3 Drawing Sheets

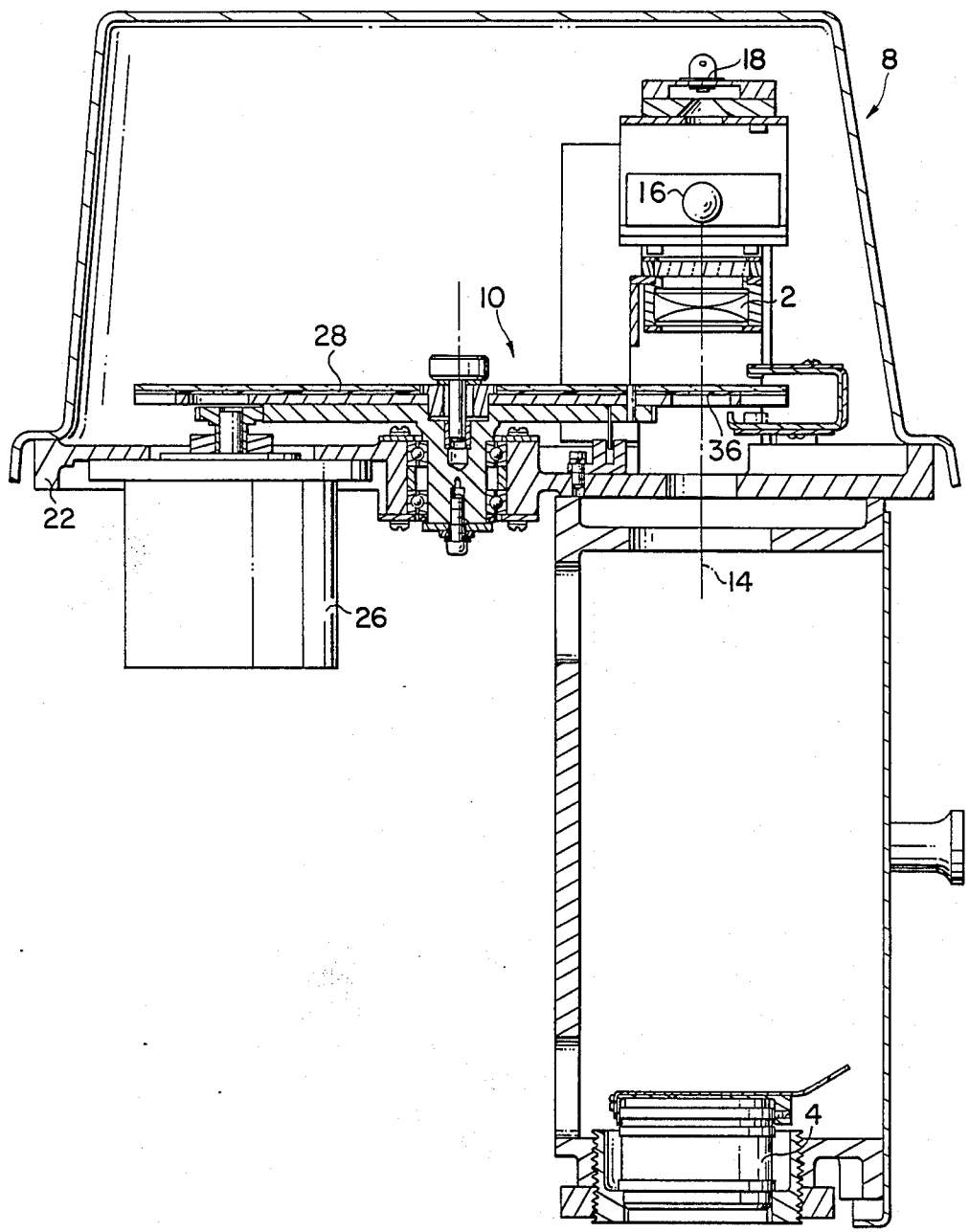
FIG. 2
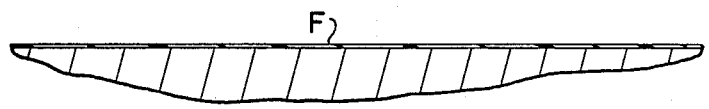

LAMP DRIVER SCHEME

CROSS-REFERENCE TO RELATED APPLICATIONS

The present application relates to co-pending application Ser. No. 153,810, filed on Feb. 8, 1988, entitled HIGH RESONANCE DRIVE TABLE AND METHOD OF MAKING A PLANAR WORK SURFACE, and application Ser. No. 157,285, filed on Feb. 17, 1988, entitled PHOTOHEAD AND SYSTEM FOR POSITIONING AN APERTURE WHEEL AND METHOD OF MAKING AN APERTURE DISC.

BACKGROUND OF THE INVENTION

The present invention relates to a system for projecting a light spot of variable intensity on a workpiece and more particularly to a system for varying the intensity of the light spot as different sized spots are projected onto a workpiece having a photosensitive work surface and for varying the intensity of the light spot as the spot is moved at velocities less than maximum to uniformly expose upon the photosenstive work surface various lines of different thicknesses in a minimal amount of time.

In forming graphic information on a photosensitive surface, line thicknesses inscribed on the surface may be varied according to the pattern of information by selectively positioning different size apertures in registry with a light beam to generate a single spot of light on the photosensitive surface. A line is generated on the photosensitive surface by the relative movement of the light spot and the photosensitive surface. It is desirable to evenly and uniformly expose different line thicknesses generated by the different aperture sizes as graphic information on the photosensitive surface. Since, for equal speeds of movement, a larger diameter light spot delivers radiant energy over a longer period of time when moved over a given incremental area on the work surface than a small diameter light spot, to obtain equal exposures the intensity required for the smaller aperture size must be greater than that of the larger aperture size. Where insufficient light is projected from the lamp, the line attempted to be created by the spot will be a hazy underexposed image. Conversely, if the amount of radiant energy projected onto the photosensitive work surface is too great, diffusion and scattering of the light beam will take place to undesirably darken unintended areas of the film to create, at best, a fuzzy undefined line on the photosensitive work surface. Thus, the intensity of the light spot projected onto the photosensitive work surface must therefore be varied to compensate for the aperture size selected.

Also, it has been found that as the light spot is moved relative to the photosensitive work surface at varying velocities, the intensity of the light spot must also be varied proportionally with the change in velocity to obtain uniform and even exposure of the lines defining the graphic information. When the light spot is moved slowly relative to the photosensitive work surface, the spot is slowly exposed projected across a given incremental area on the photosensitive work surface. When however, the light spot is moved at a faster velocity relative to the photosensitive work surface, a greater spot intensity must be generated to compensate for the shorter time that the spot is projected onto the photosensitive work surface. Accordingly, to achieve uniform exposure of the photosensitive work surface along an entire line length, the light spot intensity must be varied to generate a significantly greater light spot intensity when the light spot is moved at a faster velocity than when moved at a slower velocity.

U.S. Pat. No. 3,330,182 issued July 11, 1967 addresses the above mentioned drawbacks when exposing a light spot on a photosensitive surface. The patent employs individual filters corresponding with individual aperture sizes formed in an aperture wheel and further varies the intensity of the light beam as the beam is moved relative to a photosensitive work surface. By either rotating a variable density filter disc through the light beam or by varying the lamp illumination voltage proportionally to the speed of the spot, variable spot intensity is accomplished. However, the patent is not concerned with moving the light spot whenever possible to attain a light spot maximum velocity whenever a line is created by the relative movement of the spot and the photosensitive work surface. Also, the patent does not assign different lamp voltages to correspond with the different spot sizes to achieve uniform intensity of any size spot when any selected spot is moved at the maximum velocity. Movement of the light spot relative to the work surface at a maximum velocity is important and is a critical time saving feature when successive lines are created on the photosensitive work surface in the formation of today's complex graphic information such as found in circuit patterns. Lamp usage is accordingly minimized when graphic information is produced rapidly as a result of the light spot being constantly moved to attain the system maximum velocity. Thus, by creating graphic information with movements occurring at the maximum system velocity, longer lamp life is effected and less heat is generated by the lamp during the process. Also, as the lamp filament employed in U.S. Pat. No. 3,330,182 becomes worn with use, the illumination characteristics of the lamp may become unpredictable. Since the patent provides no means by which the emitted intensity may be checked and compensated for, creation of lines defining precise graphic information on the photosensitive work surface by the lamp may be inaccurate.

Accordingly, it is an object of the present invention to provide a system for projecting a light spot on a photosensitive surface which is moved to attain a light spot maximum velocity whenever possible to expose on a photosensitive work surface lines creating different patterns of graphic information in a miminum amount of time.

It is another object of the present invention to designate different lamp command voltages each corresponding with a different light spot size and each lamp command voltage selectively energizing a lamp to project a light spot having a uniform intensity relative to any of the other different light spot sizes when any one of the different sized light spots is moved at the maximum velocity.

It is yet another object of the present invention to utilize the actual velocity of the light spot as it moves relative to the photosensitive surface to alter any one of the designated different lamp command voltages corresponding to the different light spot sizes proportionally with respect to the actual velocity value to thereby achieve an even exposure of a line by the light spot when the light spot is moved at velocities less than maximum regardless of the selected light spot size.

Still another object of the present invention is to provide a lamp intensity feedback system sensing the actual intensity of the lamp and correcting the lamp intensity in accordance with the intensity corresponding to a selected one of the designated different lamp command voltages.

Yet a further object of the present invention is to provide a system moving a light spot to constantly attain a light spot maximum velocity whenever possible to reduce the illumination time of the lamp thus reducing heat generated by the lamp and accordingly increasing lamp life.

SUMMARY OF THE INVENTION

A system projecting a spot of radiant energy includes radiant energy emitting means for projecting the spot of radiant energy onto a surface and further includes means for providing a selection of differently sized spots. The projected spot is moved on the surface by drive means capable of moving said projected spot at a maximum velocity relative to the surface. The velocity of the spot relative to the surface is sensed by a velocity output means providing a velocity signal representing the velocity of the projected spot on the surface. The system further includes means for receiving the velocity signal generated by the velocity output means. The different sized spots are assigned different lamp command voltage signals and means are provided for selecting one of the differently sized spots for projection onto the surface. The velocity signal is multiplied with the assigned lamp command voltage corresponding to the selected one of the differently sized spots to produce a resultant lamp command voltage signal which energizes the radiant energy emitting means. When the projected spot of radiant energy is moved at velocities less than the maximum given velocity, as during the starting and stopping, or upramp and down ramp phases of the process of exposing a given line, the intensity of the spot of radiant energy projected on the surface is altered by varying a resultant lamp command voltage signal provided to the radiant energy emitting means to variably energize the radiant energy emitting means.

BRIEF DESCRIPTION OF THE DRAWINGS

FIG. 2 is an elevational sectional view taken through the photohead utilized in the photoplotter shown in FIG. 1 and further illustrates the radiant energy emitting means of the present invention.

DETAILED DESCRIPTION OF THE PREFERRED EMBODIMENT

Figure 1:
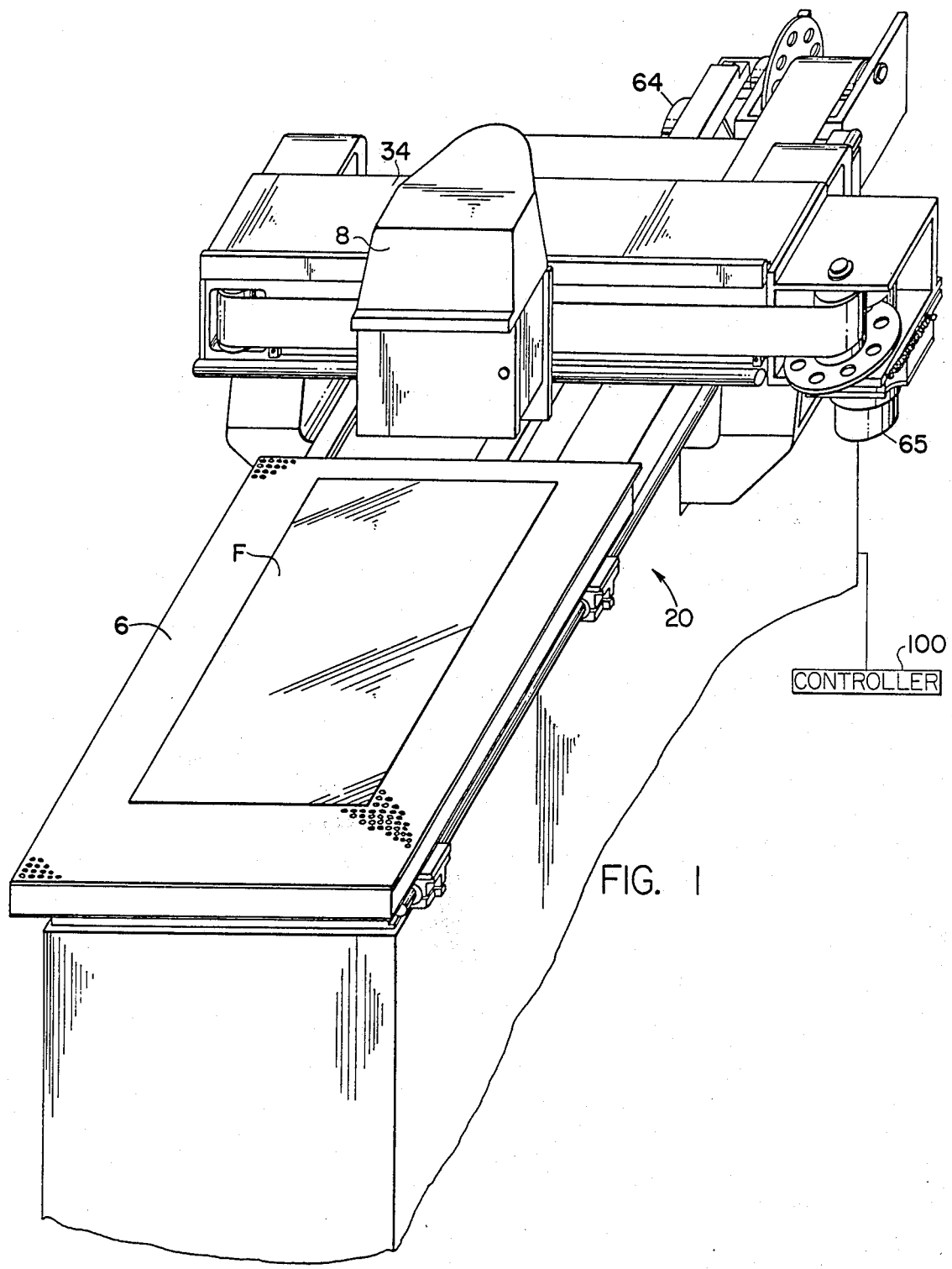
FIG. 1 is a perspective view illustrating a photoplotter utilizing the system of the present invention.

FIG. 1 illustrates an X-Y photoplotter plotter indicated generally at 20 having two belt and pulley drives respectively oriented along two orthogonal directional axes. A photohead 8, supported by an elevated bridge 34, moves along the bridge relative to a workpiece F supported on a movable work table 6. Similarly, the movable table 6 moves along a flat surface on the plotter in a direction orthogonal to the direction of movement of the photohead 8. The photohead 8 projects a focused spot of light onto a photosensitive surface of the workpiece F. Relative movement between the photohead 8 and the movable work table 6 traces a line on the photosensitive workpiece F as the photohead 8 and the work table 6 are moved relative to one another by the respective belt and pulley drives. A controller 100 defines the light spot path of travel along the workpiece F and controls the energizing and the deenergizing of X and Y coordinate drive motors 64 and 65 to displace the photohead 8 and/or the movable work table 6 a predetermined distance along the respective X and Y coordinate axes. Since it is desirable to complete the exposure of graphic information on the workpiece F in a minimum amount of a time, the electric drive motors 64 and 65 always accelerate, whenever possible given the length of the line to be plotted, the photohead 8 and the work table 6 up to a maximum given velocity along the respective coordinate axes. Thus, when both the work table 6 and the photohead 8 are driven along each respective coordinate directional axis at the maximum velocity, a maximum system velocity equal to the summation of these coordinate axes maximum velocities is achieved.

Referring to FIG. 2, the photohead 8 utilized in the system of the present invention includes an aperture wheel 10 rotatably mounted to the frame 22 indexing a selected one of a series of different sized apertures formed with the aperture wheel 10 to allow different sized and/or shaped spots t be focused on the workpiece F. A thin aperture disc 28 is supported by the wheel 10 and an incandescent lamp 16 projects light through a selected one of the apertures 36 and through a series of lenses 2 and 4 to focus a highly defined spot of light onto the workpiece F. The controller 100 also controls a step motor 26 selectively positioning one of the different sized and/or shaped apertures 36 in registry with a beam axis 14 before beginning a trace of a line having a designated different thickness. Thus, it should be understood that by varying the aperture sizes placed in registry with the beam axis 14, different diameter light spots are in turn focused on the workpiece F.

As previously mentioned, the controller 100 drives the motors 65 and 64 to move a light spot projected by the photohead 8 relative to the worktable 6 at a given system maximum velocity of, for example, four hundred inches (400") per minute. When a different sized aperture is repositioned in registry with the beam axis 14 to project another spot having a different diameter onto the workpiece F, the intensity of light generated by the lamp 16 must be sufficient to evenly expose a line having a uniform thickness on the workpiece F. Uniform exposure of lines having various thicknesses is accomplished by assigning a different lamp command voltage to correspond with the different aperture diameter selected. Each assigned voltage illuminates the lamp 16 sufficiently to project onto the workpiece F a light spot having a maximum intensity corresponding to the intensity needed when the light spot is moved at the system maximum velocity. When, however, the light spot is not moved at the system maximum velocity in instances where the spot is being accelerated or being decelerated or in instances where the resultant velocity between the X and Y drives does not equal the system maximum velocity, the assigned voltage must be compensated for by reducing it to correspond with the actual velocity occurring.

Figure 3:
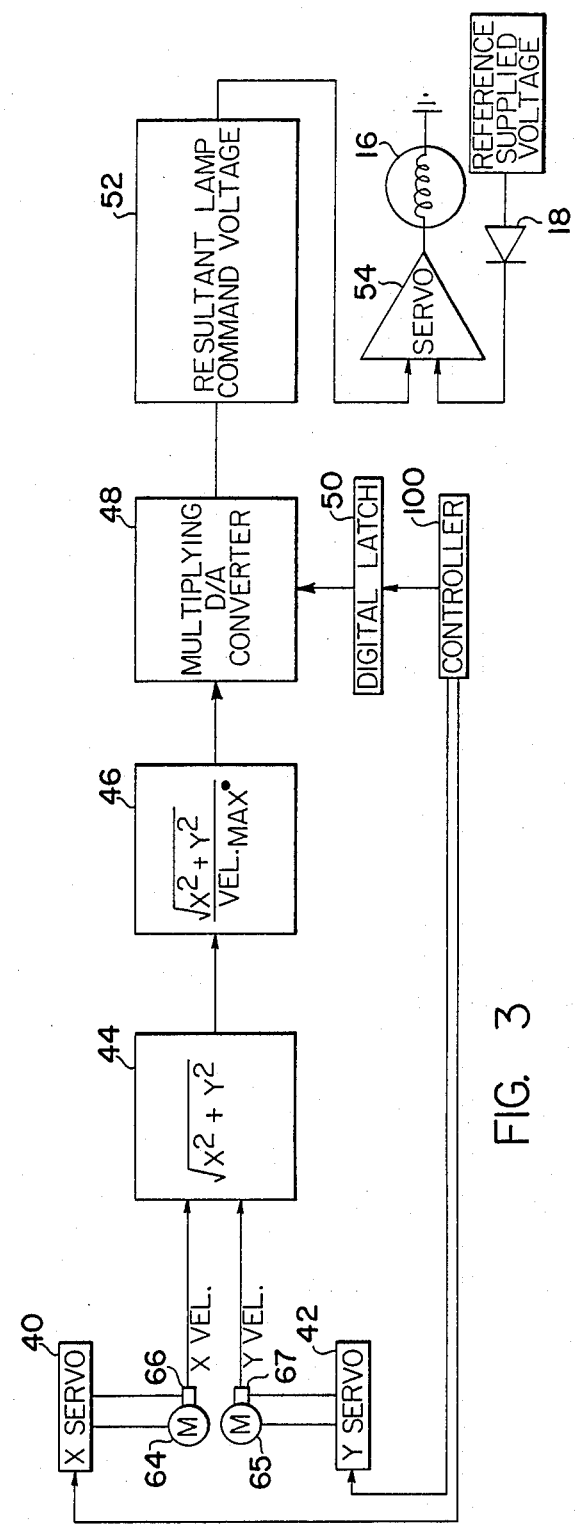
FIG. 3 is a block diagram illustrating a preferred embodiment of the control system of the present invention.

FIG. 3 illustrates the system of the present invention generating a variable resultant lamp command voltage signal having a magnitude dependent on the actual attained velocity of the light spot on to the workpiece F normalized relative to the system maximum velocity.

As previously discussed, the drive motors 64 and 65 each move the respective driven members 6 and 8 to constantly attain a maximum velocity along each corresponding coordinate axis. Each of the servosystems 40 and 42 generates a power voltage to drive the related motors 64 and 65 to a maximum rotational velocity to displace each respective driven member a predetermined distance along the related coordinate axis as determined by the controller 100. For a more complete description of the cooperation of the controller 100 with the drive servosystems, reference may be had to the copending related application Ser. No. 153,810 entitled HIGH RESONANCE DRIVE TABLE AND METHOD OF MAKING A PLANAR WORK SURFACE. Each drive motor 64 and 65 accelerates the corresponding driven member 8 and 6 to move the driven members at a maximum velocity along each respective coordinate axis and subsequently decelerates each driven member to position the driven members at a designated displacement along each respective coordinate axis. Tachometers 66 and 67 sense the drive velocities of the motors 64 and 65 and generate respective voltage signals corresponding to these velocities. Since each simultaneously occurring output signals generated by each of the tachometers 66 and 67 represents only one coordinate component of the total resultant velocity of the projected light spot moving upon the workpiece F, a resultant velocity value summating each of the X and Y velocity signals is computed. The resultant velocity value may be computed by an algorithm in the controller 100 or by utilizing a digital arithmatic circuit or an analog summer circuit depending on the type of signal generated by the tachometers 66 and 67. As illustrated by block 44 in FIG. 3, the value of each simultaneously occurring X and Y velocity signal is squared, summated together and the square root taken of the summation to produce the resultant velocity signal.

Entered into a memory of the controller 100 is data relating the particular lamp command voltages with the different aperture sizes to accomplish uniform exposure of a line on the workpiece F when any sized light spot is projected from the photohead 8. Also, the controller 100 controls the formation of the graphic information on the workpiece F utilizing data inputted into the controller memory to define the photohead path of travel relative to the workpiece F. A lamp command voltage signal corresponding to and representing the assigned lamp command voltage of the next selected aperture size is held within a digital latch 50 until the photohead 8 finishes the present trace of a line and another selected aperture size is positioned in registry with the beam axis 14. Once the selected different aperture is positioned in registry with the beam axis 14, the lamp command voltage signal stored in the digital latch 50 is then released and inputted into a multiplying digital-to-analog converter 48.

Simultaneously, the controller 100 activates the servosystems 42 and 40 to move the photohead 8 relative to the work table 6 according to data defining the next line path. As previously mentioned, the lamp command voltage signal inputted into the multiplying digital-to-analog converter 48 by the digital latch 50 is based on a maximum lamp intensity sufficient to expose on the photosensitive surface of the workpiece F the selected light spot when moved at the system maximum velocity. Since movement of the light spot from a stop position to the system maximum velocity and subsequently from the system maximum velocity to a stop position entails movement of the light spot at velocities less than maximum, means must be provided to prorate the lamp command voltage signal generated by the digital latch 50 according to the less than maximum velocities occurring. Accordingly, the resultant velocity signal, once summated as shown in block 44, is then normalized relative to a maximum signal value corresponding to the system maximum velocity. As shown in block 46, a normalized velocity signal is produced by dividing the resultant velocity signal by the system maximum velocity. Signal normalizing, like the signal summating operation, may be accomplished by the controller 100 using an algorithm or may be accomplished by utilizing hard wired circuits, such as, for example, an op-amp summer and integrator circuit. The normalized velocity signal is then inputted into the multiplying digital-to-analog converter 48 and is multiplied with the inputted lamp command voltage signal released by the digital latch 50 to generate a resultant lamp command voltage signal 52. The signal 52 varies proportionally to the ratio 46 of the actual velocity of the light spot relative to the system maximum velocity. It should be understood that the normalized signal 46 inputted into the multiplier 48 is digitally encoded prior to being inputted into the multiplier 48. Accordingly, when the photohead 8 is stationary, the resultant lamp command voltage signal is zero and no light is emitted. When the actual velocity of the light spot is, for example, one-half the system maximum velocity, the resultant lamp command voltage signal 52 would be equal to one-half the lamp command voltage signal released by the digital latch 50. Once however, the light spot attains the system maximum velocity, the resultant lamp command voltage signal will be equal to the full value of the lamp command voltage signal released by the digital latch 50 because the normalized signal 46 inputted into the multiplying converter 48 will now have a ratio equal to one. As a result, the lamp 16 projects a light spot having an intensity proportional to the ratio of the light spot velocity relative the system maximum light spot velocity to thereby provide an even and uniform exposure of a line by a light spot on a photosensitive workpiece.

The present invention is also concerned with insuring the resultant lamp command voltage signal actually energizes the lamp 16 to produce the desired light intensity. Accordingly, the system of the present invention utilizes a feedback control system to insure that the desired intensity of the lamp 16 as set forth by the signal 52 is achieved. As shown in FIG. 2, a photosensitive diode 18 is secured to a reflector positioned adjacent the lamp 16 to receive light emitted by the lamp 16 passing through an aperture formed in the reflector. Since the filaments of the lamp 16 may become worn with use, the predictability of the lamp illumination characteristics becomes uncertain. Thus, as the photosensitive diode 18 is energized by the lamp 16, the actual illumination of the lamp 16 is sensed. A servoamplifier 54 receives as input both the resultant lamp command voltage signal 52 and a voltage signal generated by the photosensitive diode 18 when energized by the lamp 16. Accordingly, the servoamplifier 54 utilizes the resultant lamp command voltage signal as a threshold voltage and generates a power voltage to the lamp 16 sufficient to illuminate the lamp 16 to create a feedback voltage in the photosensitive diode 18 balancing the demand voltage set by the resultant lamp command voltage signal 52.

It is a feature of the invention to not only expose on the photosensitive surface of the workpiece F a line but also to flash a particular shaped spot at a position on the graphic information when the photohead is stationary. The feedback system utilizing the photosensitive diode 18 and the servoamplifier 54 also insures the proper intensity of the projected particular spot shape on the photosensitive surface F by controlling the intensity of the lamp 16 according to a lamp command voltage signal designated within the controller memory for a stationary exposure of the particular shaped spot.

By the foregoing a system for projecting a light spot on a photosensitive workpiece has been described in the preferred embodiment of the invention. However, it should be understood that numerous modification and substitutions may be made without departing from the spirit of the invention. For example, while a two coordinate direction positioning system has been used in the foregoing illustration, the system of the present invention is not restricted to use in a dual coordinate system but could operate to project a varying intensity light spot that is moved relative to only one coordinate axis. The system using a single coordinate axis would exclude the step of summating two directional velocities. Accordingly, the invention has been described by way of illustration rather than limitation.

I claim:

1. A system for projecting a spot of radiant energy comprising:
    radiant energy emitting means for projecting a spot of radiant energy onto a surface, said radiant energy emitting means including means for providing a selection of differently sized spots;
    drive means for moving said projected spot of radiant energy relative to said surface, said drive means being capable of moving said spot of radiant energy relative to said surface at a given maximum velocity which is the same for all of said differently sized spots;
    velocity output means for sensing the velocity of said projected spot of radiant energy as it is moved relative to said surface by said drive means and for providing a velocity signal representing the velocity of said spot of radiant energy relative to said surface;
    means for receiving said velocity signal and for producing a normalized velocity signal therefrom by dividing said velocity signal by said given maximum velocity;
    means for assigning a different lamp command voltage signal to each of said differently sized spots;
    means for selecting one of said differently sized spots for projection onto said surface; and,
    means for multiplying said normalized velocity signal by the lamp command voltage signal assigned to said selected one of said differently sized spots to produce a resultant lamp command voltage signal which energizes said radiant energy emitting means.

2. A system as defined in claim 1 wherein said multiplying means is connected with said assigning means and said velocity output means for multiplying the normalized velocity signal by the lamp command voltage signal assigned to said selected one of said differently sized spots to thereby create a variable resultant lamp command voltage signal inputted into said radiant energy emitting means to vary energization thereof proportionally to the velocity of said projected spot when said spot is moved at velocities less than said given maximum velocity.

3. A system as defined in claim 2 wherein said assigning means includes means for temporarily holding an assigned different lamp command voltage signal.

4. A system as defined in claim 3 wherein said holding means is a digital latch storing the assigned different lamp command voltage signal and said multiplying means is a multiplying digital-to-analog converter generating said variable resultant lamp command voltage signal.

5. A system as defined in claim 3 wherein said drive means includes means for moving said projected spot of radiant energy on said surface relative to two orthogonal coordinate axes, and said velocity output means senses the velocity of said projected spot of radiant energy relative to each of said two coordinate axes and provides a first and a second velocity signal indicating the velocity of said projected spot of radiant energy relative to each coordinate axis and wherein said maximum given velocity is equal to the summation of the maximum attainable velocity of said spot along each coordinate axis.

6. A system as defined in claim 5 further comprising means for summing said first and said second velocity signals to generate a resultant velocity signal equal to the velocity of the projected spot on said surface relative to both of the orthogonal coordinate directional axes.

7. A system as defined in claim 2 wherein said system further includes feedback means receiving as inputs a feedback voltage signal and said variable lamp command voltage signal and generating a power voltage to said radiant energy emitting means to energize said radiant energy emitting means to an intensity as defined by the variable lamp command voltage.

8. A system as defined in claim 7 wherein said feedback voltage is generated by a photosensitive diode positioned adjacent to said radiant energy emitting means and is activated by radiant energy emitted by said radiant energy emitting means and wherein said feedback means further includes a servoamplifier generating said power voltage produced from the inputs of said variable lamp command voltage signal and said feedback voltage signal.

9. A system as defined in claim 8 wherein said radiant energy emitting means includes an incandescent lamp and said photosensitive diode is sensitive to incandescent light.

10. A system as defined in claim 6 wherein said system includes a controller connected with said drive means for controlling movement of said projected spot relative to said two orthogonal coordinate axes and wherein the controller includes said assigning means storing information relating said different lamp command voltage signals with each of said different sized spots.

11. A system as defined in claim 8 wherein said system further includes a photosensitive workpiece supported by said surface for movement along one of said two orthogonal coordinate axes and said radiant energy emitting means moves along the other of said two coordinate axes.

12. A photoplotter system comprising:
    a work table having a surface movable along a first coordinate directional axis;
    radiant energy emitting means movable along a second coordinate directional axis orthogonal to said first coordinate directional axis for projecting a spot of radiant energy onto said surface, said radiant energy emitting means including means for providing a selection of different sized spots;

a first drive mean for moving said surface along said first coordinate directional axis, said drive means being capable of moving said surface relative to said first coordinate directional axis at a maximum first directional velocity;

a second drive means for moving said radiant energy emitting means along said second directional coordinate axis, said drive means being capable of moving said radiant energy emitting means relative to said second directional axis at a maximum second directional velocity;

first velocity output means for sensing the velocity of said projected spot of radiant energy relative to said first coordinate directional axis and for providing a first velocity signal representing the velocity of said projected spot relative to said first coordinate directional axis;

second velocity output means for sensing the velocity of said projected spot of radiant energy relative to said second orthogonal coordinate directional axis and for providing a second velocity signal representing the velocity of said projected spot of radiant energy relative to said second orthogonal coordinate directional axis;

means for summing said first and said second velocity signals to create a resultant velocity signal therefrom;

means for receiving said resultant velocity signal and for producing a normalized velocity signal therefrom by dividing said resultant velocity signal by a system maximum velocity equal to the summation of said first and said second maximum directional velocities;

means for assigning a different lamp command voltage signal to each of said differently sized spots;

means for selecting one of said differently sized spots for projection onto said surface; and, means for multiplying said normalized velocity signal by the lamp command voltage signal assigned to said selected one of said differently sized spots to produce a resultant lamp command voltage signal which energizes said radiant energy emitting means.

13. A photoplotter system as defined in claim 12 wherein said radiant energy emitting means includes a photosensitive diode activated by radiant energy emitted by said radiant energy emitting means to generate a feedback voltage;

and wherein said system includes a servoamplifier receiving as inputs said resultant lamp command voltage signal and said feedback signal to energize the radiant energy emitting means to an intensity corresponding to the intensity defined by the resultant lamp command voltage signal.

14. A photoplotter system as set forth in claim 13 wherein said means for providing a selection of differently sized spots includes an aperture wheel having differently sized apertures formed along an arcuate path thereon defining said differently sized spots of radiant energy;

and said radiant energy emitting means further includes an incandescent lamp generating said spot of radiant energy on said surface;

and wherein said surface supports a sheet of photosensitive material.

15. A photoplotter system as defined in claim 14 wherein said assigning means further includes means for temporarily holding said lamp command voltage signal assigned to said selected one of said differently sized spots and for releasing the same into said multiplying means when a selected one of said differently sized apertures on said aperture wheel is positioned in registry with said incandescent lamp.

16. A photoplotter system as defined in claim 15 wherein said multiplying means is a multiplying digital-to-analog converter and said holding means is a digital latch.

17. A method of varying the intensity of a lamp generating a light spot movable relative to a surface comprising:

selecting a maximum velocity at which velocity the light spot is to be ultimately moved relative to the surface;

providing a means offering a selection of differently sized light spots;

assigning a different lamp command voltage signal to each of said differently sized light spots to energize the lamp to generate a maximum light spot intensity for each differently sized light spot;

selecting one of said differently sized light spots for projection onto said surface;

altering the lamp command voltage signal assigned to the selected one of said differently sized spots to reduce the intensity of the lamp proportionally with respect to the velocity of the light spot when the light spot is moved at a velocity less than the selected maximum velocity.

18. A method of varying the intensity of a lamp generating a light spot as defined in claim 17 further comprising:

providing a velocity signal representing the velocity of said light spot relative to said surface;

producing a normalized velocity signal by dividing the velocity signal by the given maximum velocity;

multiplying said normalized velocity signal by the lamp command voltage signal assigned to said selected one of said differently sized spots to alter the same and to produce a resultant lamp command voltage signal which energizes the lamp.

19. A method of varying the intensity of a lamp generating a light spot as defined in claim 18 further comprising:

providing a lamp intensity feedback means to deliver to the lamp a power voltage;

varying the power voltage to the lamp to generate a lamp intensity corresponding to the lamp intensity defined by the resultant lamp command voltage.

* * * * *